(12) United States Patent
Morita et al.

(10) Patent No.: US 11,439,005 B2
(45) Date of Patent: Sep. 6, 2022

(54) INDUCTOR BRIDGE AND ELECTRONIC DEVICE

(71) Applicant: Murata Manufacturing Co., Ltd., Nagaokakyo (JP)

(72) Inventors: Isamu Morita, Nagaokakyo (JP); Bunta Okamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 938 days.

(21) Appl. No.: 16/217,096

(22) Filed: Dec. 12, 2018

(65) Prior Publication Data

US 2019/0116659 A1    Apr. 18, 2019

Related U.S. Application Data

(63) Continuation of application No. PCT/JP2017/022786, filed on Jun. 21, 2017.

(30) Foreign Application Priority Data

Jun. 22, 2016  (JP) .............................. JP2016-123210
Dec. 2, 2016   (JP) .............................. JP2016-234938

(51) Int. Cl.
*H01F 27/29*    (2006.01)
*H05K 1/11*     (2006.01)
(Continued)

(52) U.S. Cl.
CPC ......... *H05K 1/028* (2013.01); *H01F 17/0006* (2013.01); *H01F 27/2804* (2013.01);
(Continued)

(58) Field of Classification Search
CPC .... H01F 17/0006; H01F 27/292; H01F 27/29; H01F 27/2804; H05K 1/028; H05K 1/09;
(Continued)

(56) References Cited

U.S. PATENT DOCUMENTS

| | | | |
|---|---|---|---|
| 9,666,352 B2 | 5/2017 | Yosui et al. | |
| 2015/0294781 A1 | 10/2015 | Yosui et al. | |
| 2015/0340151 A1 | 11/2015 | Yosui et al. | |

FOREIGN PATENT DOCUMENTS

| | | |
|---|---|---|
| JP | 5743034 B2 | 7/2015 |
| JP | 2015-156513 A | 8/2015 |
| WO | 2014/129279 A1 | 8/2014 |

OTHER PUBLICATIONS

Official Communication issued in International Patent Application No. PCT/JP2017/022786, dated Sep. 19, 2017.

*Primary Examiner* — Jeremy C Norris
(74) *Attorney, Agent, or Firm* — Keating & Bennett, LLP

(57) ABSTRACT

An inductor bridge includes an inductor in a flexible, flat plate-shaped element body including resin bases that are laminated, and a wiring unit connected in series to the inductor. The inductor includes wound conductor patterns, each with a winding axis in a laminating direction of the resin bases and respectively provided on each of the resin bases, and an interlayer connection conductor interlayer-connecting the wound conductor patterns. The wiring unit includes a wiring pattern at a layer between a first surface of the wound conductor pattern and a layer farthest from the first surface and interlayer connection conductors conducted to the wiring pattern.

18 Claims, 9 Drawing Sheets

(51) Int. Cl.
*H05K 1/02* (2006.01)
*H01F 17/00* (2006.01)
*H01F 27/28* (2006.01)
*H05K 1/09* (2006.01)
*H05K 1/14* (2006.01)
*H05K 1/16* (2006.01)

(52) U.S. Cl.
CPC ........... *H01F 27/29* (2013.01); *H01F 27/292* (2013.01); *H05K 1/09* (2013.01); *H05K 1/11* (2013.01); *H05K 1/14* (2013.01); *H01F 2017/006* (2013.01); *H01F 2027/2809* (2013.01); *H05K 1/148* (2013.01); *H05K 1/165* (2013.01); *H05K 2201/0141* (2013.01)

(58) Field of Classification Search
CPC . H05K 1/11; H05K 1/14; H05K 1/148; H05K 1/165
USPC ......................................... 333/200, 223, 232
See application file for complete search history.

INDUCTOR BRIDGE AND ELECTRONIC DEVICE

CROSS REFERENCE TO RELATED APPLICATIONS

This application claims the benefit of priority to Japanese Patent Application No. 2016-123210 filed on Jun. 22, 2016 and Japanese Patent Application No. 2016-234938 filed on Dec. 2, 2016, and is a Continuation Application of PCT Application No. PCT/JP2017/022786 filed Jun. 21, 2017. The entire contents of these applications are hereby incorporated herein by reference.

BACKGROUND OF THE INVENTION

1. Field of the Invention

The present invention relates to an element that connects two circuits, and particularly to an inductor bridge including an inductance component and an electronic device including the inductor bridge.

2. Description of the Related Art

Conventionally, in a small electronic device such as a mobile terminal, in the case in which members of a mounting circuit, such as a plurality of boards, are provided in a casing, for example, as disclosed in WO 2014/129279, the members of the mounting circuit are connected to each other by a flat cable having flexibility.

FIG. 9 is an exploded perspective view illustrating one inductor bridge of WO 2014/129279. The inductor bridge includes a flat plate-shape element body having flexibility, a first connector 51, and a second connector 52. The element body is formed by laminating resin bases 11, 12, 13, 14. Connector mounting electrodes 41, 42, a wiring pattern 21, and a wound conductor pattern 31 are formed on the resin base 11. Wound conductor patterns 32, 33 are formed on the resin bases 12, 13, respectively. A wiring pattern 23 and a wound conductor pattern 34 are formed on the resin base 14. Resist layers 61, 62 are formed on top and bottom surfaces of the element body.

The inductor bridge disclosed in WO 2014/129279 has the flexible, flat plate-shaped element body formed by a lamination of a plurality of resin bases, an inductor is formed in the element body, and a first connection unit connected to a first circuit and a second connection unit connected to a second circuit are provided on a first surface of the element body.

The flexible inductor bridge disclosed in WO 2014/129279 is often provided in a restricted space inside the electronic device while being bent at a predetermined location thereof. However, when the inductor bridge is bent at a location at which the inductor is formed, sometimes an electric characteristic, such as inductance, may change before and after bending. On the other hand, when the inductor bridge is bent at the wiring pattern, although the electric characteristic is slightly changed, disconnection of the wiring pattern or peeling of the conductor pattern from the resin base is easily generated due to the bending.

SUMMARY OF THE INVENTION

As described above, the inventors of the present invention have discovered that there is a problem in that the electrical reliability is hardly secured even if the inductor bridge is bent in any one of the inductor and the wiring unit.

Preferred embodiments of the present invention provide highly reliable inductor bridges and electronic devices, which are each capable of downsizing or miniaturizing the electronic device including an electronic circuit including the inductor.

According to a preferred embodiment of the present invention, an inductor bridge, which is an element that bridge-connects a first circuit and a second circuit, includes a flat plate-shaped element body having flexibility and including a plurality of resin bases that are laminated; a first connection unit provided on a first surface of the element body and connected to the first circuit; a second connection unit provided on the first surface and connected to the second circuit; an inductor electrically connected between the first connection unit and the second connection unit and provided in the element body; and a wiring unit connected in series to the inductor. The inductor includes wound conductor patterns, each of which has a winding axis in a laminating direction of the plurality of resin bases and is respectively provided on each of the plurality of resin bases, and an interlayer connection conductor interlayer-connecting the wound conductor patterns, and the wiring unit includes a wiring pattern and a plurality of interlayer connection conductors connected to the wiring pattern, the wiring pattern being provided at a single layer or a plurality of layers, the single layer or the plurality of layers being different from the first surface and a layer of the wound conductor pattern farthest from the first surface, and being located between the first surface and the layer farthest from the first surface.

With the above-described configuration, the wiring pattern of the wiring unit in the element body is prevented from being peeled off. The interlayer connection conductor is hardly broken. Thus, the disconnection and the peeling of the wiring pattern due to stress during bending of the wiring unit are reduced or prevented.

The wiring pattern may be provided in a plurality of layers, and the wiring pattern and the interlayer connection conductor may be disposed stepwise from a layer closest to the layer farthest from the first surface to a layer close to the first surface. Consequently, the interlayer connection conductors are not laminated at the same location and are dispersedly disposed, so that the disconnection and the peeling of the wiring pattern due to the stress during the bending are more effectively prevented.

The wiring pattern may include a wiring pattern portion that overlaps the wound conductor pattern in planar view and a conductor pattern that does not overlap the wound conductor pattern in planar view, and the wiring pattern portion that overlaps the wound conductor pattern may be located farther from the wound conductor pattern than the conductor pattern that does not overlap the wound conductor pattern in the laminating direction. Consequently, unnecessary parasitic capacitance generated between the wound conductor pattern and the wiring pattern is prevented. The wiring pattern, which does not overlap the wound conductor pattern in planar view but is located at a bending position, is located close to a middle height of a laminated body, so that disconnection or peeling due to the bending is more reliably prevented.

The element body may include a bending portion that is bent at a position at which the wiring pattern is provided. Consequently, the stress applied to the inductor is reduced, and electrical reliability is improved.

According to a preferred embodiment of the present invention, an electronic device includes the inductor bridge according to a preferred embodiment of the present invention; a first circuit; and a second circuit. The first circuit and the second circuit are connected to each other with the inductor bridge interposed therebetween.

With the above-described configuration, the electronic device including the inductor bridge with high electrical reliability is obtained.

According to preferred embodiments of the present invention, highly reliable inductor bridges and electronic circuits each including an inductor bridge are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
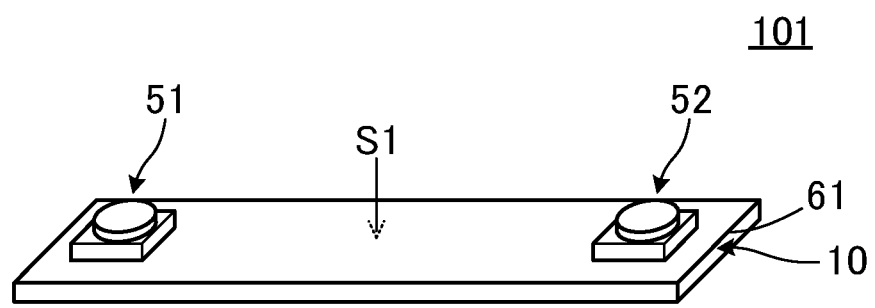
FIG. 1A is an external perspective view of an inductor bridge according to a first preferred embodiment of the present invention.

Hereinafter, a plurality of preferred embodiments of the present invention will be described with reference to the drawings by describing several specific examples. In each drawing, the same or similar component is denoted by the same reference numeral. The preferred embodiments are separately illustrated in consideration of description of a main point or ease of understanding, but configurations of different preferred embodiments may be partially substituted or combined. In the second and subsequent preferred embodiments, the description of elements and features common to that of the first preferred embodiment is omitted, and only different elements and features will be described. In particular, the same operation and advantageous effects with the same configuration will not be described in each preferred embodiment.

First Preferred Embodiment

Figure 1B:
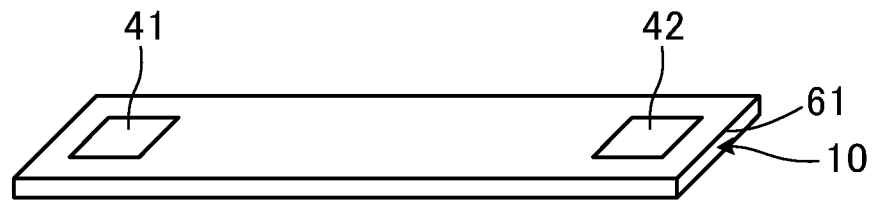
FIG. 1B is an exploded perspective view illustrating the inductor bridge in a state before connectors are attached.

FIG. 1A is an external perspective view of an inductor bridge 101 according to a first preferred embodiment of the present invention, and FIG. 1B is an exploded perspective view illustrating the inductor bridge 101 in a state before connectors are attached.

As illustrated in FIG. 1A, the inductor bridge 101 includes a flexible, flat plate-shaped element body 10, and a first connector 51 and a second connector 52 that are provided on a first surface S1 of the element body 10. An inductor (to be described later) is provided in the element body 10. The first connector 51 is disposed on a connector mounting electrode 41 provided at a first end of the element body 10, and connected to a first circuit in a mechanical contact manner. The second connector 52 is disposed on a connector mounting electrode 42 provided at a second end of the element body 10, and connected to a second circuit in a mechanical contact manner. The first connector 51 corresponds to the first connection unit, and the second connector 52 corresponds to the second connection unit.

Figure 2:
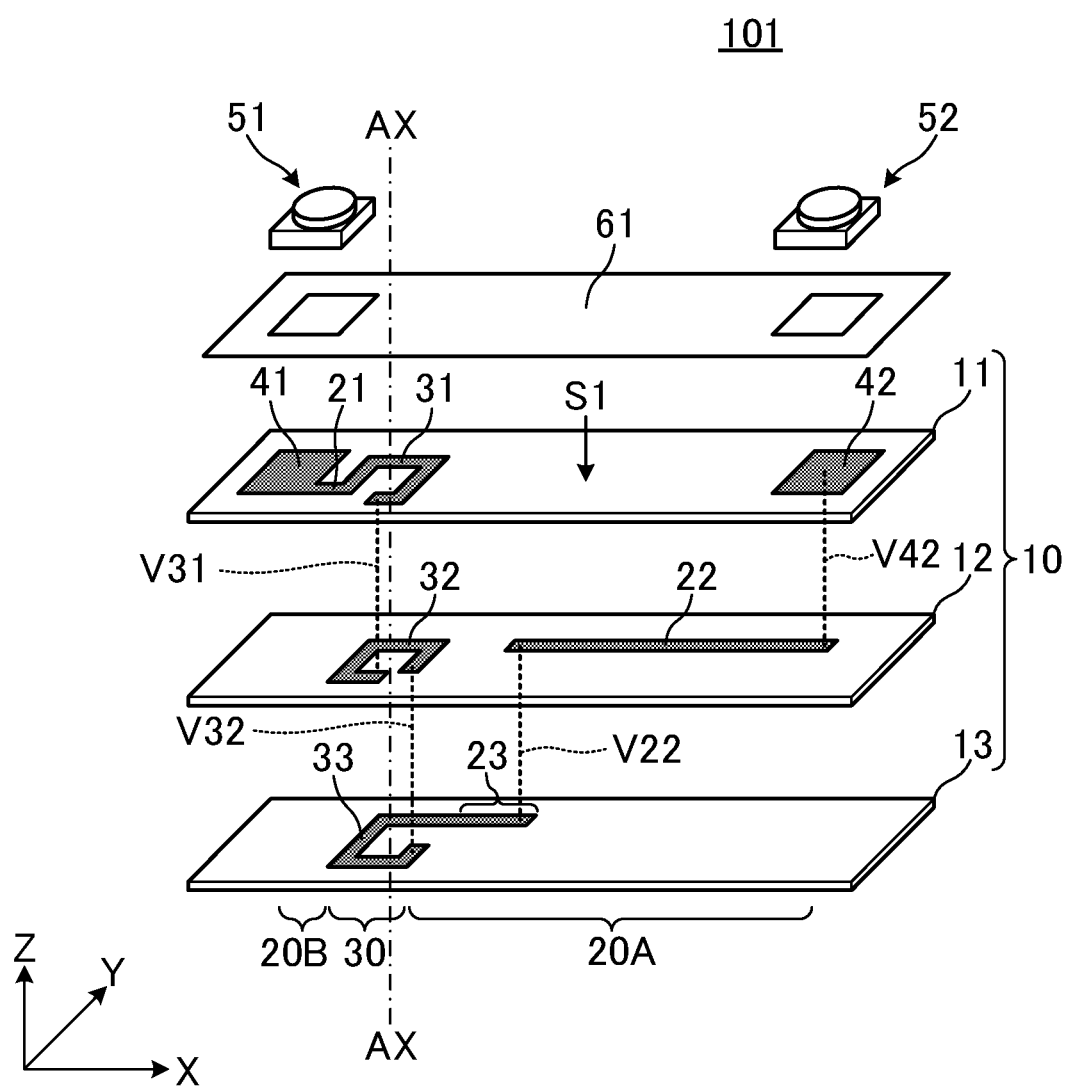
FIG. 2 is an exploded perspective view of the inductor bridge in FIG. 1A.

FIG. 2 is an exploded perspective view of the inductor bridge 101. The element body 10 preferably may be formed by laminating bases 11, 12, 13 made of a thermoplastic resin, such as a liquid crystal polymer (LCP), for example. Interlayer connection conductors V31, V42, a wound conductor pattern 31, a wiring pattern 21, and the connector mounting electrodes 41, 42 are formed on the resin base 11. Interlayer connection conductors V32, V22, a wound conductor pattern 32, and a wiring pattern 22 are formed on the resin base 12. A wound conductor pattern 33 and a wiring pattern 23 are formed on the resin base 13.

For example, each of the conductor patterns is preferably formed by patterning a Cu foil laminated on a resin base. The interlayer connection conductor is preferably a conductive paste, wherein the conductive paste is printed and filled in a hole made in a resin base, and solidified by heating and pressurization after lamination.

The wound conductor patterns 31, 32, 33 and the interlayer connection conductors V31, V32 define an inductor 30 including a helical conductor pattern having a winding axis AX in a laminating direction of the resin bases 11, 12, 13.

A first wiring unit 20A includes the wiring patterns 22, 23 and the interlayer connection conductors V42, V22. A second wiring unit 20B includes the wiring pattern 21.

The wiring pattern 22 is located in an intermediate layer (a layer that is not an outermost layer) of the element body 10. The wiring pattern 22 and the interlayer connection conductors V22, V42 correspond to the wiring unit, and the wiring pattern 22 corresponds to the wiring pattern that is one of components of the wiring unit.

In the case in which the inductor bridge 101 is bent, the inductor bridge 101 is bent so as to be bent at a position of the wiring pattern 22.

With the above-described configuration, the inductor provided in the element body 10 of FIG. 1A and the wiring unit connected in series to the inductor are electrically connected between the first connector 51 and the second connector 52.

Figure 3:
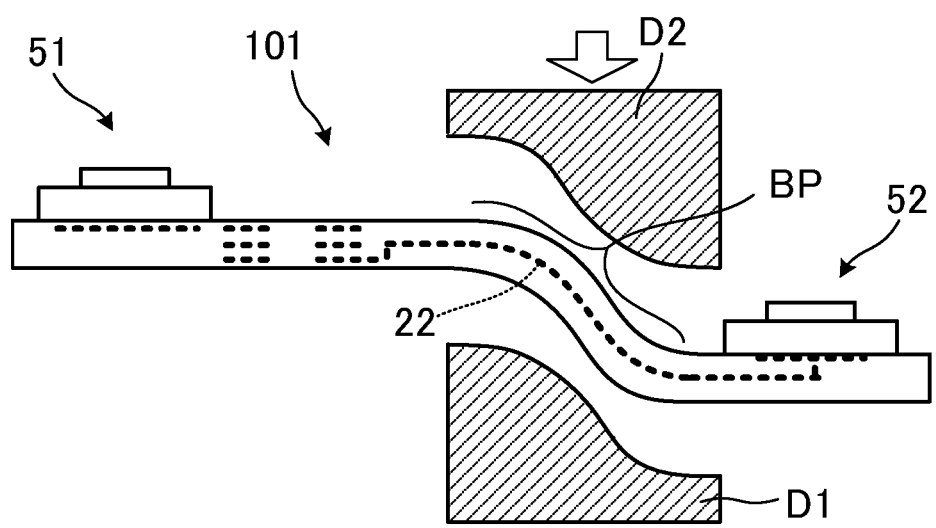
FIG. 3 is a side view illustrating how the inductor bridge in FIG. 1A is bent.

FIG. 3 is a side view illustrating how the inductor bridge 101 is bent. The configuration of the inductor bridge 101 is illustrated in FIGS. 1A, 1B, and 2. Because the resin base of the inductor bridge 101 is made of thermoplastic resin, such as the liquid crystal polymer (LCP), for example, as described above, the resin base is easily plastically deformed by heating and pressurization using a metal mold. Using the press dies D1, D2 in FIG. 3, bending stress is applied to the bent portion BP of the wiring unit 20A of the inductor bridge 101. As a result, the inductor bridge 101 is bent at the bent portion BP. The bent portion BP is provided at a position existing within a range in which the wiring pattern 22 is provided.

Figure 4:
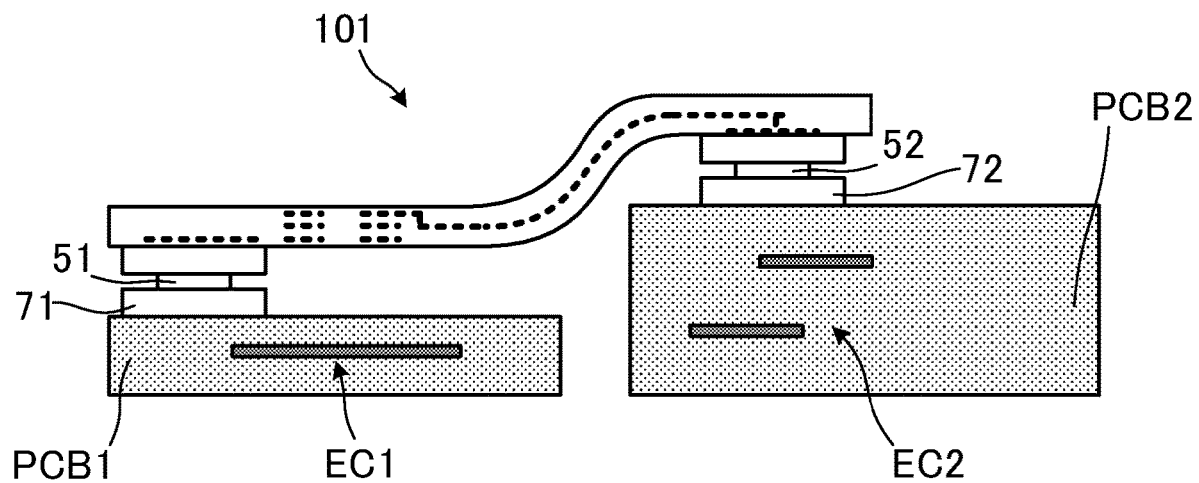
FIG. 4 is a side view illustrating a state in which a first circuit board and a second circuit board are connected using the inductor bridge in FIG. 1A.

FIG. 4 is a side view illustrating a state in which a first circuit board PCB1 and a second circuit board PCB2 are connected using the inductor bridge 101. A first receptacle 71 and a first circuit EC1 connected to the receptacle 71 are provided on the first circuit board PCB1. A second receptacle 72 and a second circuit EC2 connected to the receptacle 72 are provided on the second circuit board PCB2. The first connector 51 of the inductor bridge 101 is connected to the first receptacle 71, and the second connector 52 of the inductor bridge 101 is connected to the second receptacle 72. Consequently, the inductor bridge 101 connects the first circuit EC1 and the second circuit EC2.

According to the first preferred embodiment, the wiring pattern 22 located in the intermediate layer (the layer that is not the outermost layer) of the element body 10 is provided in the element body 10, and the bending stress is hardly applied, so that peeling of the wiring pattern 22 in the element body 10 is prevented. In particular, when the wiring pattern 22 is provided in a neutral plane free from compressive strain or tensile strain, peeling is very effectively prevented.

Typically, the interlayer connection conductor is made of metal that is difficult to deform as compared with a resin base. Further, the interlayer connection conductor is provided within a small area in a surface direction such that the wiring pattern has high density. When being continuously and linearly provided over a plurality of layers as in the conventional case, the interlayer connection conductor is easily broken or disconnected due to the influence of the bending stress of the element body. On the other hand, in the first preferred embodiment, the interlayer connection conductors V22, V42 are largely spaced away from each other in the surface direction of the resin base (an X-axis direction in FIG. 2). A line length of the wiring pattern 22 is longer than that of other wiring patterns. That is, the interlayer connection conductors V22, V42 are also spaced away from the bent portion. Thus, destruction of the interlayer connection conductors V22, V42 is prevented. As a result, the inductor bridge 101 has stable electrical characteristics.

Second Preferred Embodiment

An inductor bridge in which the configurations of the inductor and the wiring unit are different from those of the first preferred embodiment will be described in a second preferred embodiment of the present.

Figure 5:
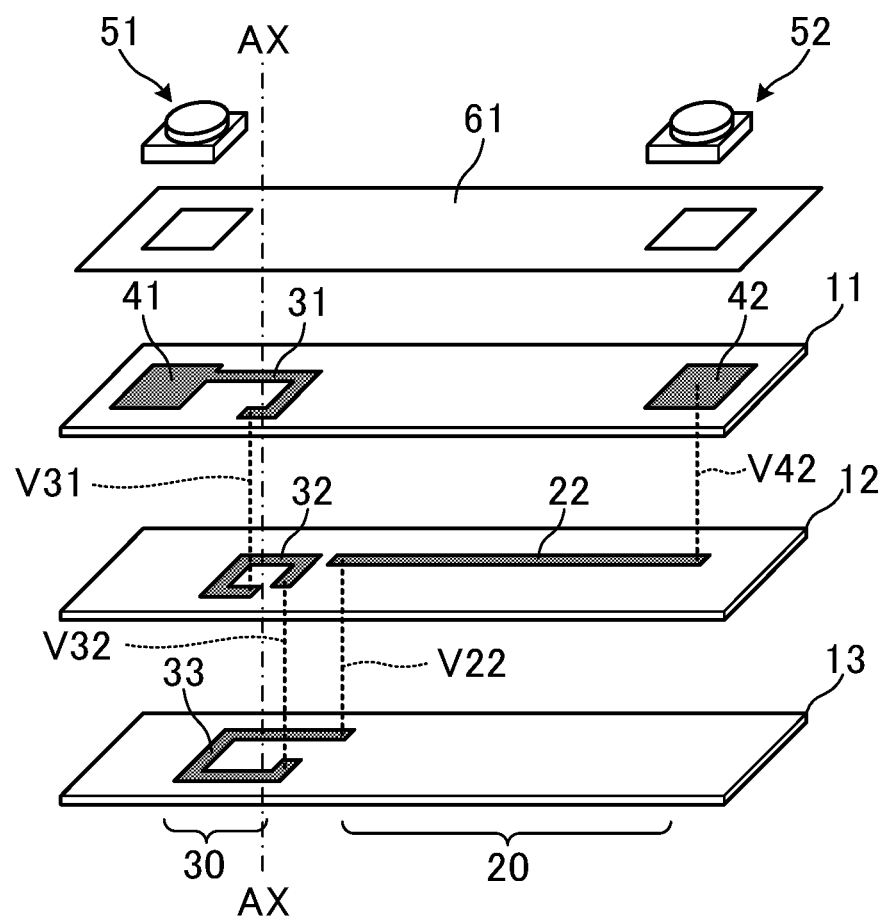
FIG. 5 is an exploded perspective view of an inductor bridge according to a second preferred embodiment of the present invention.

FIG. 5 is an exploded perspective view of an inductor bridge 102 according to the second preferred embodiment. The interlayer connection conductors V31, V42, the wound conductor patterns 31 and the connector mounting electrodes 41, 42 are provided on the resin base 11. Interlayer connection conductors V32, V22, a wound conductor pattern 32, and a wiring pattern 22 are provided on the resin base 12. The wound conductor pattern 33 is provided on the resin base 13.

The wound conductor patterns 31, 32, 33 and the interlayer connection conductors V31, V32 define the inductor 30 including a helical conductor pattern having a winding axis AX in the laminating direction of the resin bases 11, 12, 13.

The wiring unit 20 includes the wiring pattern 22 and the interlayer connection conductors V22, V42. The wiring unit 20 corresponds to the wiring unit. The wiring pattern 22 corresponds to the wiring pattern that is one of the components of the wiring unit.

Because a winding diameter of the wound conductor pattern 33 of the second preferred embodiment is larger than winding diameters of the wound conductor patterns 31, 32, the wound conductor pattern 33 and the wiring pattern 22 are directly connected to each other with the interlayer connection conductor V22 interposed therebetween. One end of the wound conductor pattern 31 is directly connected to the connector mounting electrode 41. Other configurations are the same as or similar to the inductor bridge 101 of the first preferred embodiment.

Even in the case that the single wiring pattern 22 is provided as in the second preferred embodiment, the advantageous effects of the first preferred embodiment are obtained.

Third Preferred Embodiment

An inductor bridge in which the configuration of the wiring unit is different from that of the first and second preferred embodiments will be illustrated in a third preferred embodiment of the present invention.

Figure 6:
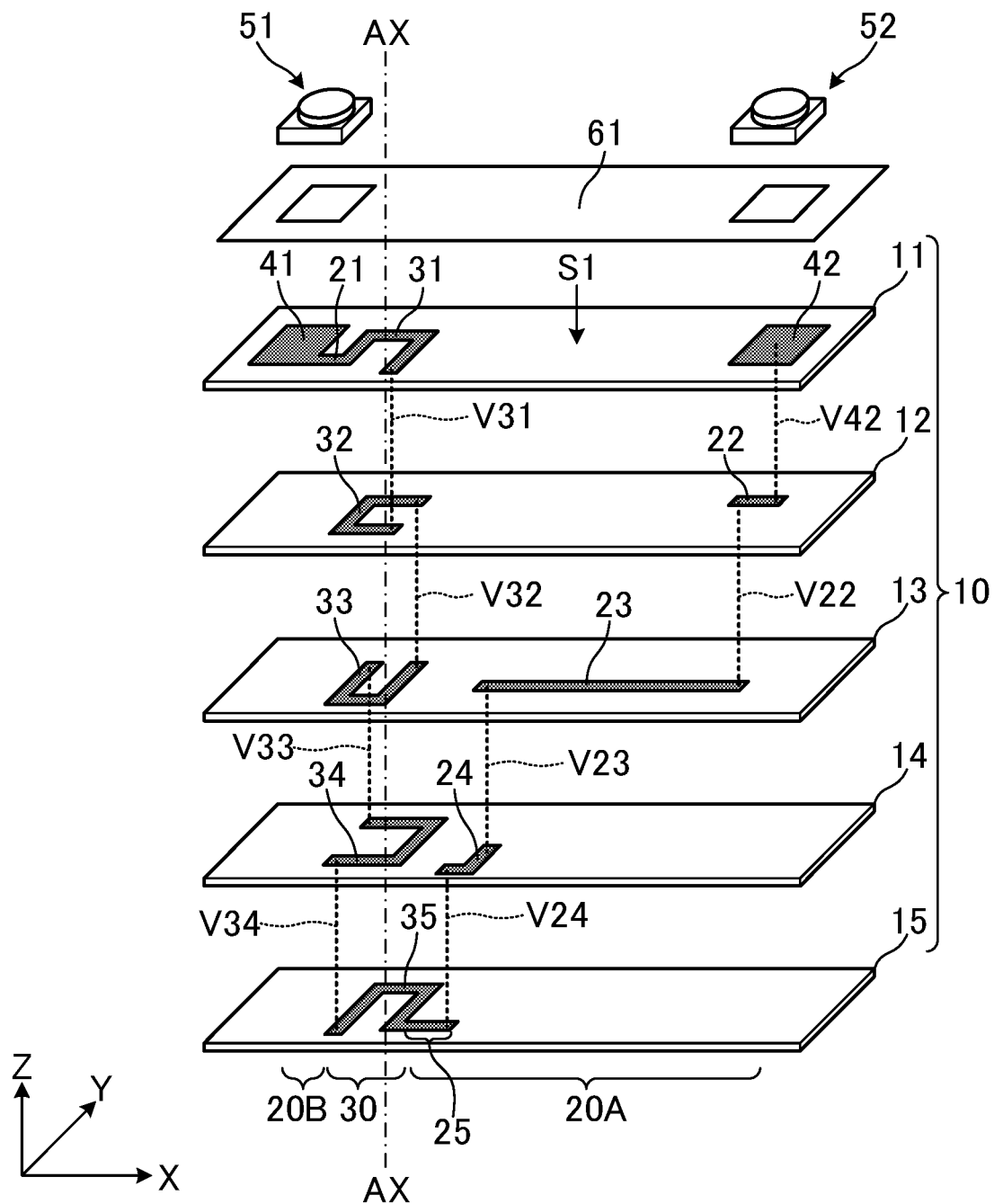
FIG. 6 is an exploded perspective view of an inductor bridge according to a third preferred embodiment of the present invention.

FIG. 6 is an exploded perspective view of an inductor bridge 103 according to the third preferred embodiment. The interlayer connection conductors V31, V42, the wound conductor patterns 31, the wiring patterns 21, and the connector mounting electrodes 41, 42 are provided on the resin base 11. The interlayer connection conductors V32, V22 and the wound conductor pattern 32 are provided on the resin base 12. The interlayer connection conductors V33, V23, the wound conductor pattern 33, and the wiring pattern 23 are provided on the resin base 13. Interlayer connection conductors V34, V24, a wound conductor pattern 34, and a wiring pattern 24 are provided on a resin base 14. A wound conductor pattern 35 and a wiring pattern 25 are provided on a resin base 15.

The inductor 30 including the helical conductor pattern having the winding axis in the laminating direction (Z-axis direction) of the resin bases 11, 12, 13, 14, 15 is defined by the wound conductor patterns 31, 32, 33, 34, 35 and the interlayer connection conductors V31, V32, V33, V34.

The first wiring unit 20A includes the wiring patterns 22, 23, 24, 25 and the interlayer connection conductors V42, V22, V23, V24. A second wiring unit 20B includes the wiring pattern 21.

The longest wiring pattern 23 is provided in the layer closest to the middle layer among the plurality of wiring patterns 22, 23, 24, 25. Other configurations are the same as or similar to those of the first and second preferred embodiments.

The wiring patterns 22, 23, 24 and the interlayer connection conductors V22, V23, V42 correspond to the wiring unit, and the wiring patterns 22, 23, 24 correspond to the wiring pattern.

When the inductor bridge 103 is bent, it is bent at a predetermined position of the first wiring unit 20A. In particular, the inductor bridge 103 is preferably bent at a position at which the longest wiring pattern 23 is provided, such that the longest wiring pattern 23 is provided in the layer closest to the middle layer among the plurality of wiring patterns 22, 23, 24, 25. Consequently, the wiring pattern 23 in the element body 10 is prevented from being peeled.

In the inductor bridge 103 of the third preferred embodiment, the plurality of wiring patterns 22, 23, 24, 25 and the plurality of interlayer connection conductors V42, V22, V23, V24 are provided stepwise from the wiring pattern 24 of the resin base 14 close to the resin base 15 farthest from the first surface S1 to the wiring pattern 22 of the resin base 12 close to the first surface S1.

According to the third preferred embodiment, even if the number of layers increases, because overlapping of the interlayer connection conductors (a density distribution of the interlayer connection conductors) is reduced, the bending stress due to bending of the inductor bridge 103 is not significantly applied to the interlayer connection conductors, and destruction of the interlayer connection conductors V42, V22, V23, V24 is effectively prevented.

Fourth Preferred Embodiment

An inductor bridge in which the configuration of the wiring pattern is different from that of the first and second preferred embodiments will be described in a fourth preferred embodiment of the present invention.

Figure 7:
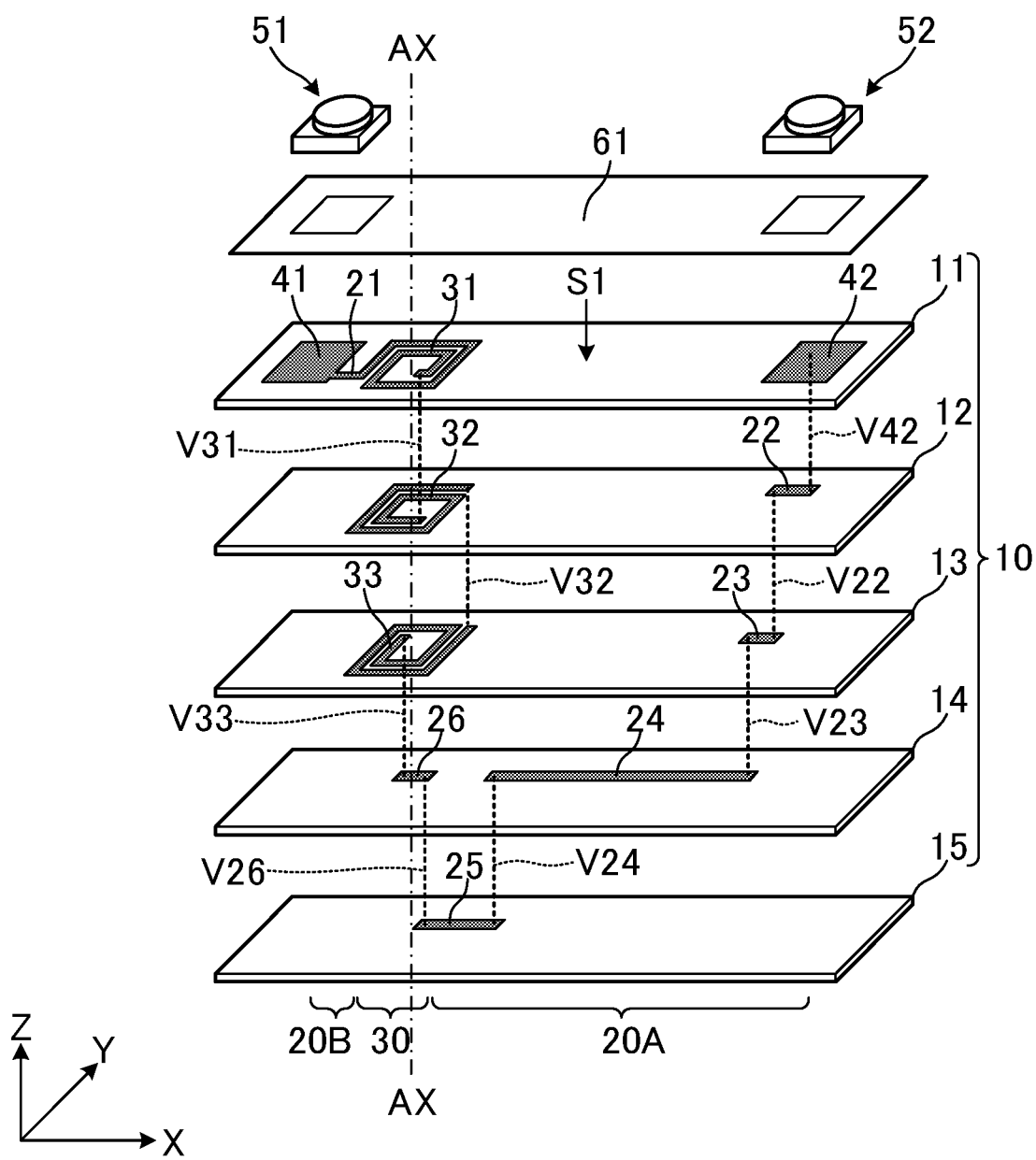
FIG. 7 is an exploded perspective view of an inductor bridge according to a fourth preferred embodiment of the present invention.

FIG. 7 is an exploded perspective view of an inductor bridge 104 according to the fourth preferred embodiment. The interlayer connection conductors V31, V42, the wound conductor patterns 31, the wiring patterns 21, and the connector mounting electrodes 41, 42 are provided on the resin base 11. Interlayer connection conductors V32, V22, a wound conductor pattern 32, and a wiring pattern 22 are provided on the resin base 12. The interlayer connection conductors V33, V23, the wound conductor pattern 33, and the wiring pattern 23 are provided on the resin base 13. Interlayer connection conductors V26, V24 and wiring patterns 26, 24 are provided on the resin base 14. The wiring pattern 25 is provided on the resin base 15. Other configurations are illustrated in the first preferred embodiment.

The wound conductor patterns 31, 32, 33 and the interlayer connection conductors V31, V32 define an inductor 30 including a helical conductor pattern having a winding axis AX in a laminating direction of the resin bases 11, 12, 13.

The first wiring unit 20A includes the wiring patterns 22 to 25 and the interlayer connection conductors V42, V22, V23, V24, V26. A second wiring unit 20B includes the wiring pattern 21. The wiring pattern 26 and the interlayer connection conductor V33 define a portion of the helical conductor pattern.

Each of the wound conductor patterns 31, 32, 33 is preferably a coil pattern including at least one turn (in this example, a rectangular or substantially rectangular spiral conductor pattern, for example). When the wound conductor pattern is a coil pattern including at least one turn, the wiring pattern defining the conductor pattern from the inside to the outside of the coil partially overlaps the wound conductor pattern in planar view.

In FIG. 7, the wiring pattern 25 overlaps the wound conductor patterns 31, 32, 33 in planar view, and the wiring pattern 24 does not overlap the wound conductor patterns 31, 32, 33 in planar view. In this manner, the wiring pattern 25 overlapping the wound conductor patterns 31, 32, 33 is preferably located at a position farther from the wound conductor patterns 31, 32, 33 than the wiring pattern 24 that does not overlap the wound conductor patterns 31, 32, 33 in the laminating direction. With this configuration, unnecessary parasitic capacitance generated between the wound conductor pattern and the wiring pattern is prevented. The wiring pattern (the wiring pattern 24, for example), which does not overlap the wound conductor pattern in planar view and is located at a position to be bent, is located close to a middle height of a laminated body, so that the generation of the disconnection or the peeling due to the bending is reduced or prevented.

In the case in which the wiring pattern 26 is not regarded as a portion of the helical conductor pattern, the wiring pattern 26 overlaps the wound conductor patterns 31, 32, 33 in planar view. In this manner, in the case in which the plurality of wiring patterns overlap the wound conductor patterns 31, 32, 33, at least one wiring pattern (wiring pattern 25) is located farther from the wound conductor patterns 31, 32, 33 than the conductor pattern (the wiring pattern 24, for example) that does not overlap the wound conductor patterns 31, 32, 33 in the lamination direction, which obtains the parasitic capacitance reducing effect.

The wiring patterns 25, 24, 23, 22 are provided in a plurality of layers, and the wiring patterns 25, 24, 23, 22 and the interlayer connection conductors V24, V23, V22, V42 are disposed stepwise from the layer farthest from the first surface S1 to the layer close to the first surface S1. Consequently, the interlayer connection conductors V24, V23, V22, V42 are not laminated at the same location but are dispersedly disposed, so that the disconnection and peeling of the wiring pattern due to the stress during the bending are further prevented.

Fifth Preferred Embodiment

An example of an electronic device will be described in a fifth preferred embodiment of the present invention.

Figure 8:
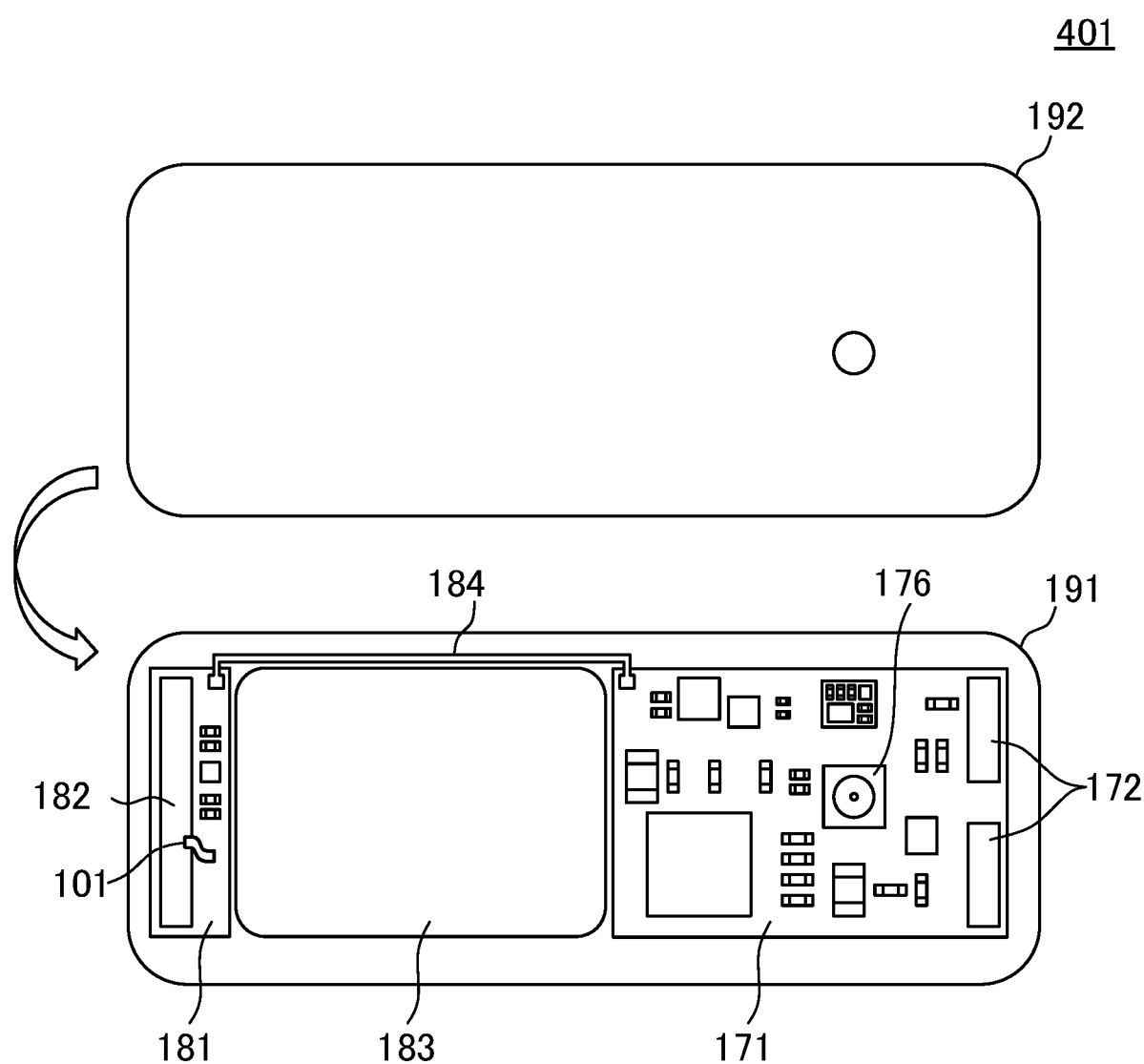
FIG. 8 is a plan view illustrating a structure inside a casing of an electronic device according to a fifth preferred embodiment of the present invention, and a state in which the inside is exposed while an upper casing and a lower casing are separated from each other.
Figure 9:
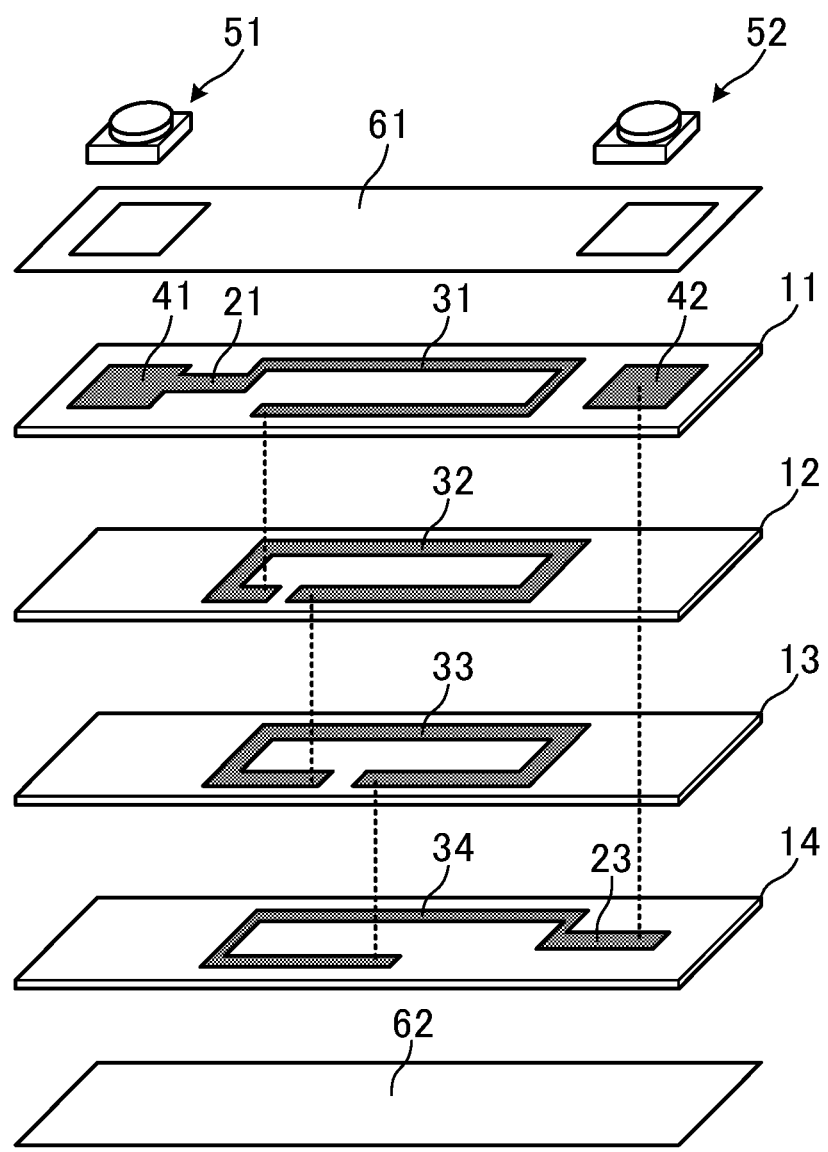
FIG. 9 is an exploded perspective view of one inductor bridge of WO 2014/129279.

FIG. 8 is a view illustrating a structure in a casing of an electronic device 401 according to the fifth preferred embodiment, and is a plan view illustrating a state in which an inside of the electronic device 401 is exposed while an upper casing 191 and a lower casing 192 are separated. For example, the electronic device 401 is preferably a smartphone or a tablet PC, and is equipped with the inductor bridge 101 in FIG. 1A.

Wiring boards 171, 181, a battery pack 183, and other components are accommodated in the upper casing 191. A UHF band antenna 172, a camera module 176, and other components are also mounted on the wiring board 171. A UHF band antenna 182 and other components are mounted on the wiring board 181. The wiring board 171 and the wiring board 181 are connected to each other by a cable 184.

The wiring board 181 and the antenna 182 are connected to each other by the inductor bridge 101. The configuration of the inductor bridge 101 is illustrated in FIG. 1A, and the inductor bridge 101 is used while bent as illustrated in FIG. 4.

An inductor bridge may also be applied to the cable 184 connecting the wiring boards 171 and 181.

Although the inductor bridge including the linear wiring pattern is illustrated in each of the preferred embodiments described above, a portion or an entirety of the wiring pattern may be curved.

The inductor including the wound conductor pattern having the rectangular or substantially rectangular outer shape is provided in each of the above-described preferred embodiments. Alternatively, the outer shape of the wound conductor pattern may have a circular, substantially circular, elliptical, substantially elliptical, oval, or substantially oval shape. A portion or an entirety of the outer shape of the wound conductor pattern may be curved.

An example in which the inductor including the wound conductor pattern having the same or substantially the same line width is provided is illustrated in each of the above-described preferred embodiments. Alternatively, the line width of the wound conductor pattern may vary in each layer.

An example in which the inductor including the wound conductor pattern having the same or substantially the same winding diameter is provided is illustrated in each of the above-described preferred embodiments. Alternatively, the winding diameter of the wound conductor pattern may vary in each layer.

An example in which the inductor having the winding axis AX in the laminating direction of the resin base is provided is illustrated in each of the above-described preferred embodiments. Alternatively, the winding axis AX may be inclined with respect to the laminating direction of the resin base.

In each of the above-described preferred embodiments, as an example of the connection between the connection unit and the first circuit and the connection between the connection unit and the second circuit, the connector is electrically connected in a mechanical contact manner. Alternatively, the connection with the first circuit and the connection with the second circuit may be provided using a conductive bonding material, such as solder, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inductor bridge bridge-connecting a first circuit and a second circuit, the inductor bridge comprising:
   a flat plate-shaped element body having flexibility and including a plurality of resin bases that are laminated;
   a first connection unit provided on a first surface of the element body and connected to the first circuit;
   a second connection unit provided on the first surface and connected to the second circuit;
   an inductor electrically connected between the first connection unit and the second connection unit and provided in the element body; and
   a wiring unit connected in series to the inductor; wherein
   the inductor includes wound conductor patterns, each of which has a winding axis in a laminating direction of the plurality of resin bases and is respectively provided on each of the plurality of resin bases, and an interlayer connection conductor interlayer-connecting the wound conductor patterns; and
   the wiring unit includes a wiring pattern and a plurality of interlayer connection conductors connected to the wiring pattern, the wiring pattern being provided at a single layer or a plurality of layers, the single layer or the plurality of layers being different from the first surface and a layer of the wound conductor pattern farthest from the first surface and being located between the first surface and the layer farthest from the first surface.

2. The inductor bridge according to claim 1, wherein the wiring pattern is provided at the plurality of layers; and
   the wiring pattern and the interlayer connection conductors are disposed stepwise from a layer closest to the layer farthest from the first surface to a layer close to the first surface.

3. The inductor bridge according to claim 1, wherein the wiring pattern includes a wiring pattern portion that overlaps the wound conductor pattern in planar view and a conductor pattern that does not overlap the wound conductor pattern in planar view; and
   the wiring pattern portion that overlaps the wound conductor pattern is located farther from the wound conductor pattern than the conductor pattern that does not overlap the wound conductor pattern in the laminating direction.

4. The inductor bridge according to claim 1, wherein the element body includes a bending portion that is bent at a position at which the wiring pattern is provided.

5. The inductor bridge according to claim 1, wherein
   the first connection unit is disposed on a connector mounting electrode provided at a first end of the element body, and connected to a first circuit in a mechanical contact manner; and
   the second connection unit is disposed on a connector mounting electrode provided at a second end of the element body, and connected to a second circuit in a mechanical contact manner.

6. The inductor bridge according to claim 1, wherein the plurality of resin bases are made of a liquid crystal polymer.

7. The inductor bridge according to claim 1, wherein the wound conductor pattern and the wiring pattern are made of a Cu foil.

8. The inductor bridge according to claim 1, wherein each of the wound conductor patterns includes at least one turn.

9. The inductor bridge according to claim 1, wherein each of the wound conductor patterns is a rectangular or substantially rectangular spiral conductor pattern.

10. An electronic device comprising:
    the inductor bridge according to claim 1;
    the first circuit: and
    the second circuit; wherein
    the first circuit and the second circuit are connected to each other with the inductor bridge interposed therebetween.

11. The electronic device according to claim 10, wherein the wiring pattern is provided at the plurality of layers; and
    the wiring pattern and the interlayer connection conductors are disposed stepwise from a layer closest to the layer farthest from the first surface to a layer close to the first surface.

12. The electronic device according to claim 10, wherein the wiring pattern includes a wiring pattern portion that overlaps the wound conductor pattern in planar view and a conductor pattern that does not overlap the wound conductor pattern in planar view; and
    the wiring pattern portion that overlaps the wound conductor pattern is located farther from the wound conductor pattern than the conductor pattern that does not overlap the wound conductor pattern in the laminating direction.

13. The electronic device according to claim 10, wherein the element body includes a bending portion that is bent at a position at which the wiring pattern is provided.

14. The electronic device according to claim 10, wherein
    the first connection unit is disposed on a connector mounting electrode provided at a first end of the element body, and connected to a first circuit in a mechanical contact manner; and
    the second connection unit is disposed on a connector mounting electrode provided at a second end of the element body, and connected to a second circuit in a mechanical contact manner.

15. The electronic device according to claim 10, wherein the plurality of resin bases are made of a liquid crystal polymer.

16. The electronic device according to claim 10, wherein the wound conductor pattern and the wiring pattern are made of a Cu foil.

17. The electronic device according to claim 10, wherein each of the wound conductor patterns includes at least one turn.

18. The electronic device according to claim 10, wherein each of the wound conductor patterns is a rectangular or substantially rectangular spiral conductor pattern.

* * * * *